United States Patent
Wanek et al.

(10) Patent No.: US 6,806,700 B2
(45) Date of Patent: Oct. 19, 2004

(54) HARD DRIVE TEST FIXTURE

(75) Inventors: Donald J. Wanek, Rochester, MN (US); Richard L. Sands, Rochester, MN (US)

(73) Assignee: Pemstar, Inc., Rochester, MN (US)

( * ) Notice: Subject to any disclaimer, the term of this patent is extended or adjusted under 35 U.S.C. 154(b) by 398 days.

(21) Appl. No.: 10/125,653

(22) Filed: Apr. 18, 2002

(65) Prior Publication Data

US 2003/0150284 A9 Aug. 14, 2003

Related U.S. Application Data

(60) Provisional application No. 60/286,732, filed on Apr. 25, 2001.

(51) Int. Cl.[7] ............................. G01R 31/01; G01R 1/04
(52) U.S. Cl. ..................................... 324/158.1; 73/865.9
(58) Field of Search ........................ 73/865.6, 865.8, 73/865.9; 324/537, 760, 764, 158.1

(56) References Cited

U.S. PATENT DOCUMENTS

| | | |
|---|---|---|
| 2,614,413 A | 10/1952 | Alley, Jr. |
| 3,302,615 A | 2/1967 | Tietji |
| 4,313,679 A | 2/1982 | Wolff et al. |
| 4,521,333 A | 6/1985 | Graham et al. |
| 4,926,118 A | 5/1990 | O'Connor et al. |
| 5,021,732 A | 6/1991 | Fuoco et al. |
| 5,072,177 A | 12/1991 | Liken et al. |
| 5,126,656 A | 6/1992 | Jones |
| 5,147,136 A | 9/1992 | Hartley et al. |
| 5,195,384 A | 3/1993 | Duesler, Jr. et al. |
| 5,446,394 A | 8/1995 | Cassidy |
| 5,450,018 A | 9/1995 | Rieser et al. |
| 5,675,098 A | 10/1997 | Hobbs |
| 5,721,669 A | 2/1998 | Becker et al. |
| 5,767,424 A | 6/1998 | Breunsbach et al. |
| 5,927,504 A | 7/1999 | Han et al. |
| 6,124,707 A * | 9/2000 | Kim et al. ............... 324/158.1 |
| 6,141,780 A | 10/2000 | Lee |
| 6,169,413 B1 | 1/2001 | Paek et al. |
| 6,227,701 B1 | 5/2001 | Wu |
| 6,272,767 B1 | 8/2001 | Botruff et al. |

FOREIGN PATENT DOCUMENTS

| | | |
|---|---|---|
| EP | 617293 A2 | 9/1994 |
| EP | 0834879 A1 | 4/1998 |
| JP | 57-98583 | 6/1982 |
| JP | 57-151842 | 9/1982 |
| JP | 5-172733 | 7/1993 |
| JP | 7-140062 | 6/1995 |
| RU | 1578596 A1 | 7/1990 |
| RU | 1251043 A2 | 8/1996 |
| WO | WO 97/06532 | 2/1997 |

* cited by examiner

*Primary Examiner*—Evan Pert
(74) *Attorney, Agent, or Firm*—Sean D. Solberg; Dorsey & Whitney, LLP

(57) ABSTRACT

The present invention is a hard drive test fixture for supporting a hard drive during quality control testing. The test fixture includes a pan having a base. Rails are attached to the base of the pan for providing structural support to the pan and for positioning of the hard drive. A connection card is removably attached to the rails and is adapted for connection to the hard drive. The test fixture includes an ejection rod for facilitating removal of the hard drive from the test fixture.

23 Claims, 7 Drawing Sheets

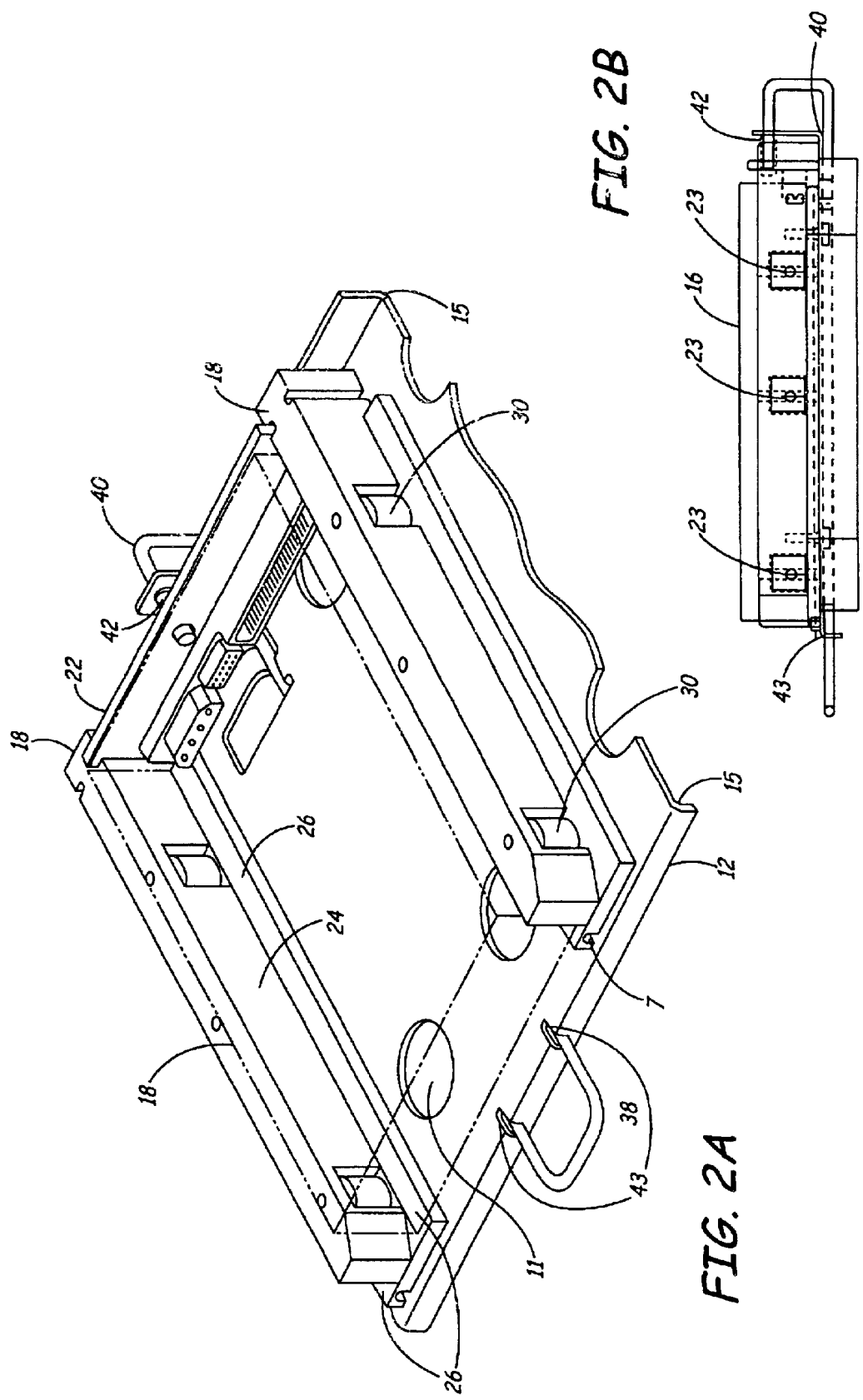

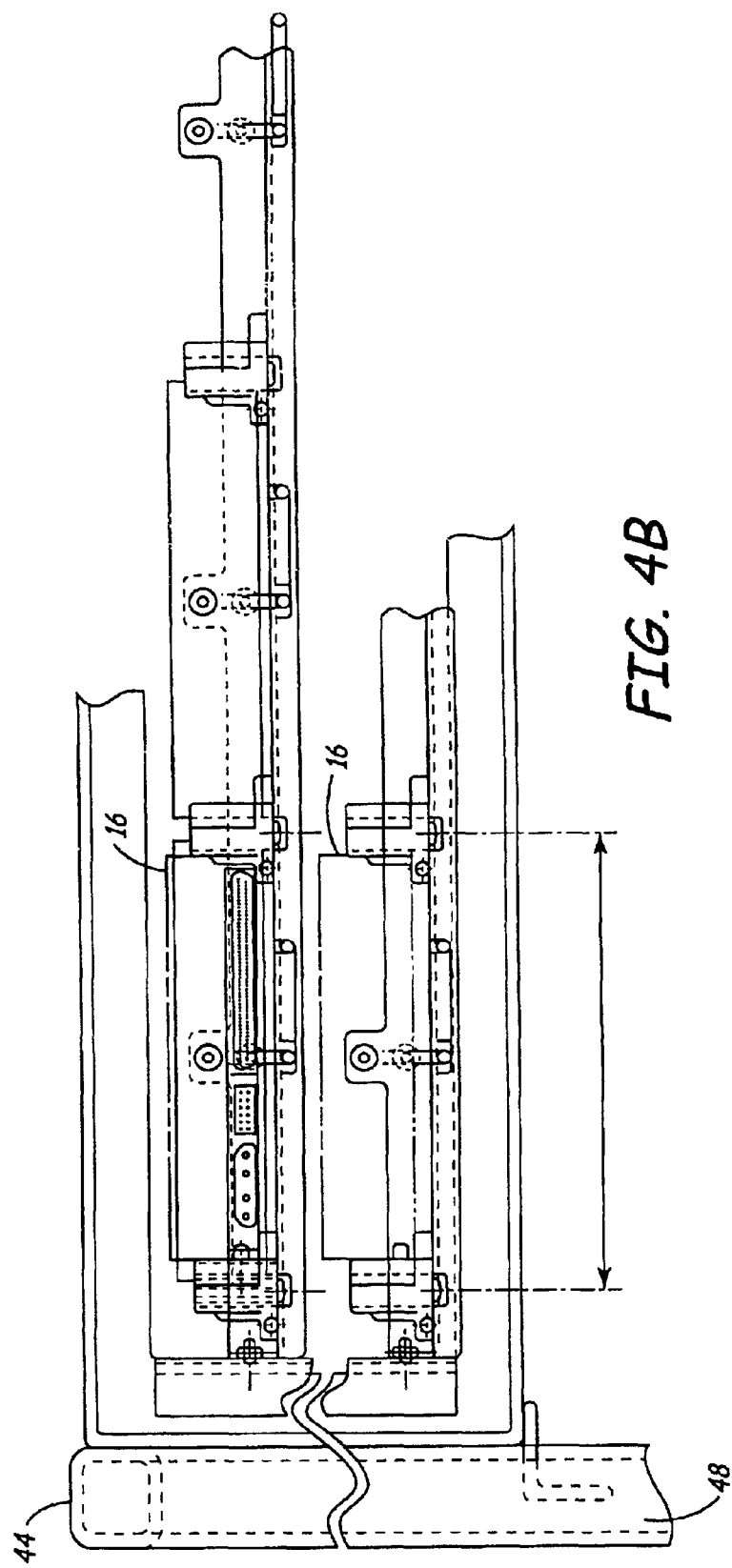

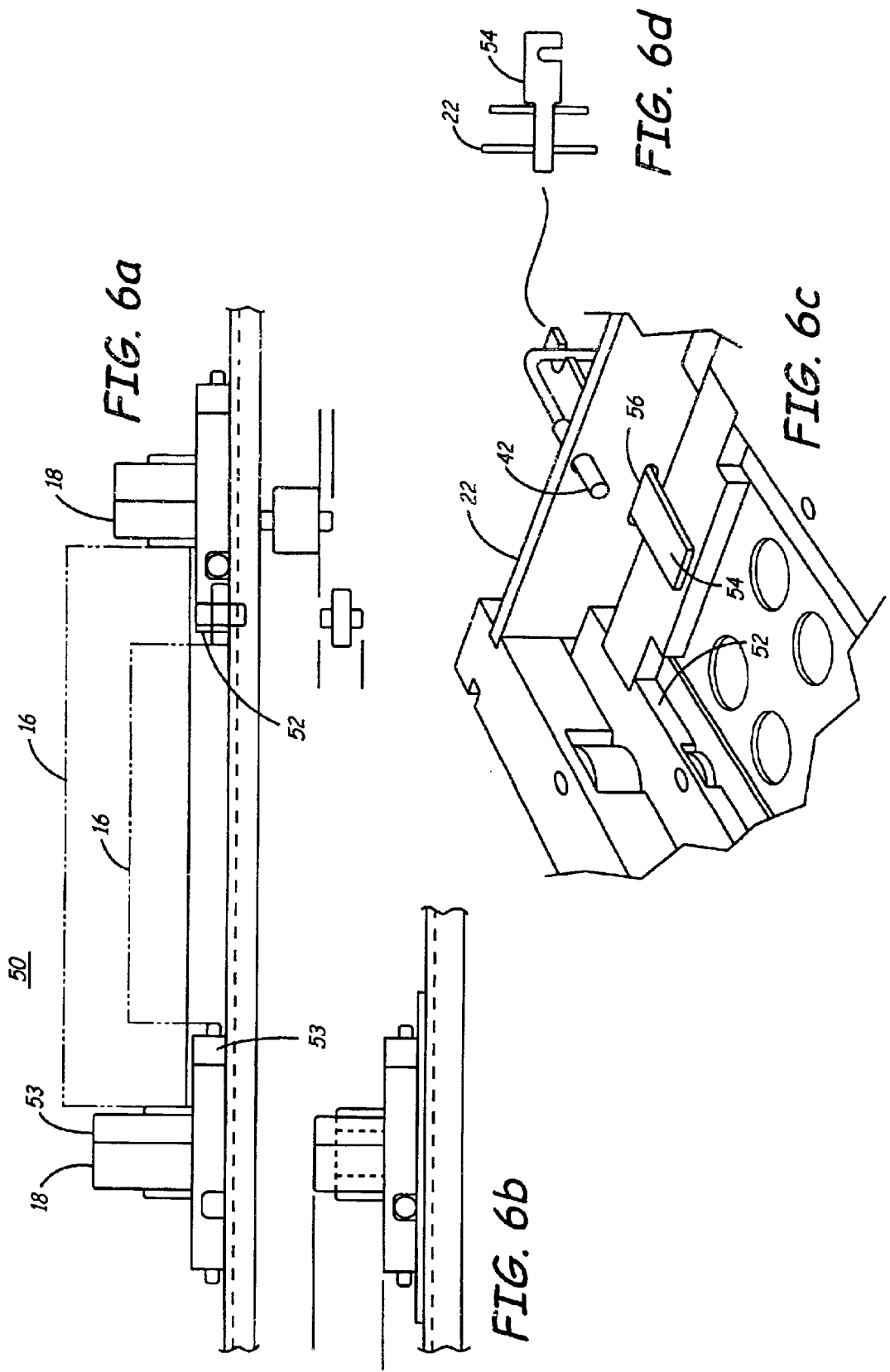

HARD DRIVE TEST FIXTURE

CROSS-REFERENCE TO RELATED APPLICATION(S)

This application claims priority from provisional No. 60/286,732, dated Apr. 25, 2001.

FIELD OF THE INVENTION

The present invention relates generally to an environmental chamber for testing hard drives. More specifically, the present invention relates to a fixture for securing and testing a hard drive while in an environmental chamber.

BACKGROUND OF THE INVENTION

Computer hard drives are generally subjected to a "burn-in" testing procedure conducted in an environmentally controlled test chamber. These chambers are designed to isolate the drive from vibrations, from temperature changes, and from humidity changes so that the drive manufacturer can obtain accurate performance test results.

Computer hard drives are also usually subjected to thermal testing or environmental conditioning testing during the design and prototyping phases of the manufacturing process. This testing, also known as "final verification" testing, is also typically conducted in large environmental test chambers. During these tests, it is desirable to have controlled and stabilized air temperature and airflow rate around the devices under test. The test temperature and airflow rate are selected by the manufacturer to simulate the thermal stress range of conditions that the device under test is realistically expected to experience in its useful life. Alternatively, the test temperature and airflow may be selected to include some multiple of the worst expected conditions. These tests can provide a valuable tool to verify product quality and reliability and to assure that the hard drives meet industry standards.

Typical hard drive test fixtures in the prior art are precision machined to close tolerance, making them relatively expensive to fabricate. Furthermore, prior art test fixtures are typically built to handle only one type of hard drive. Consequently, there is a need in the art for a low-cost hard drive test fixture, and for a fixture which is adaptable to accommodate disk drives of varying sizes.

BRIEF SUMMARY OF THE INVENTION

Accordingly, the present invention is a test fixture for supporting a hard drive during testing. The test fixture can be used to store hard drives undergoing testing, and can be adapted for insertion into an environmental testing chamber. The test fixture includes a pan, a test card coupled to the pan, and a bearing surface for guiding a hard drive to the test card.

In one embodiment, rails are attached to the base of the pan for providing structural support to the pan and to provide a bearing surface for positioning of the hard drive. A connection card is located in place between the rails and is adapted for connection to the hard drive. The test fixture also includes an ejection rod for facilitating removal of the hard drive from the test fixture.

In an alternate embodiment, the test fixture includes a pan, a test card coupled to the pan, a first bearing surface coupled to the pan, and a second bearing surfaced coupled to the pan. The first and second bearing are each adapted to guide a hard drive of a particular size to the test card. In this configuration, the test fixture is easily adapted to test hard drives of varying sizes.

While multiple embodiments are disclosed, still other embodiments of the present invention will become apparent to those skilled in the art from the following detailed description, wherein is shown and described only the embodiments of the invention, by way of illustration, of the best modes contemplated for carrying out the invention. As will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

FIG. 2A is a perspective view of a hard drive test fixture, according to one embodiment of the present invention.

FIG. 2B is an elevated side view of a hard drive test fixture, according to one embodiment of the present invention.

FIG. 4b is an overhead planar view of a hard drive test assembly engaged to a shelf of an environmental test chamber.

FIG. 6a shows a sectional view of a hard drive test assembly according to a second embodiment of the present invention.

FIG. 6b shows a sectional view of a rail according to a second embodiment of the present invention.

FIG. 6c shows a sectional view of a hard drive test assembly according to a second embodiment of the present invention.

FIG. 6d shows an overhead planar view of an ejection plate.

DETAILED DESCRIPTION

Figure 1A:
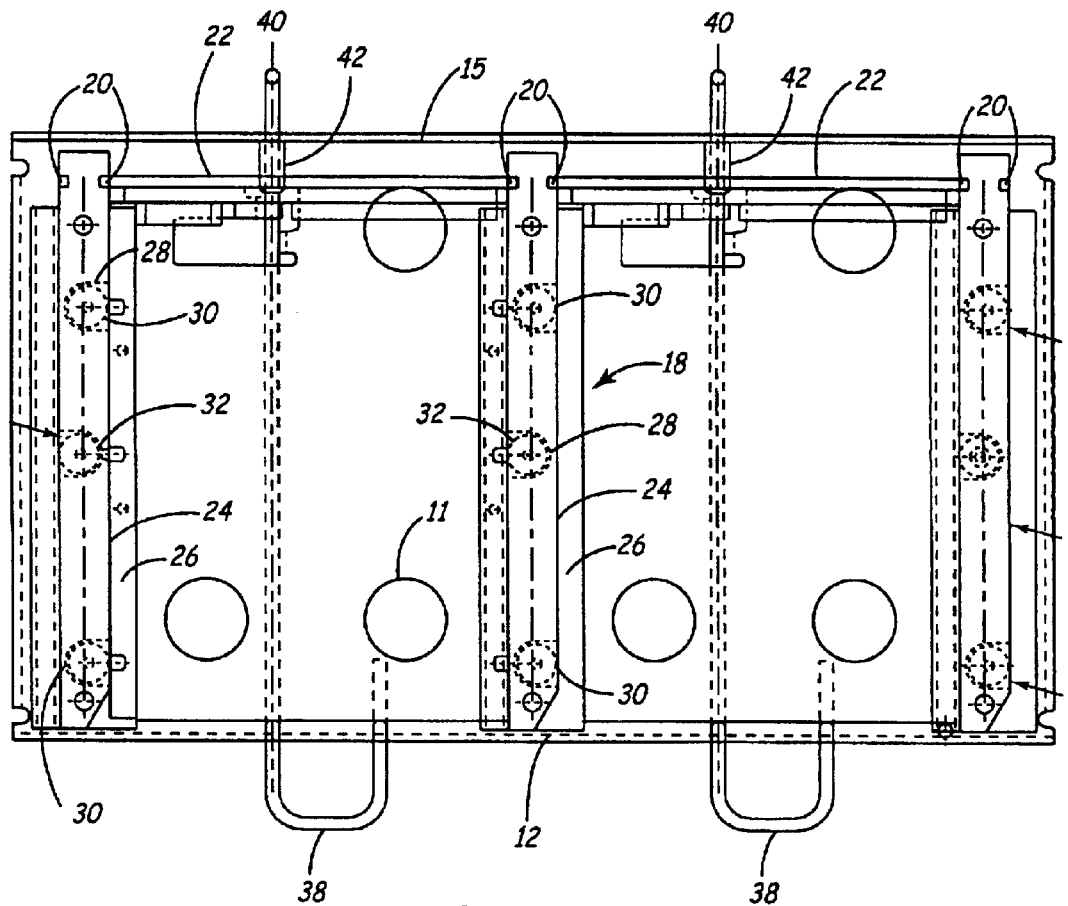
FIG. 1A is a top view of a hard drive test fixture, according to one embodiment of the present invention.

As shown in FIG. 1A, the present invention is a test fixture 10 specially adapted to support a hard drive during testing and to interface thereto. The subject invention is especially suited for use within an environmental chamber, but is easily adapted to cooperate with racks or storage cabinets that are generally known in the art.

Figure 1B:
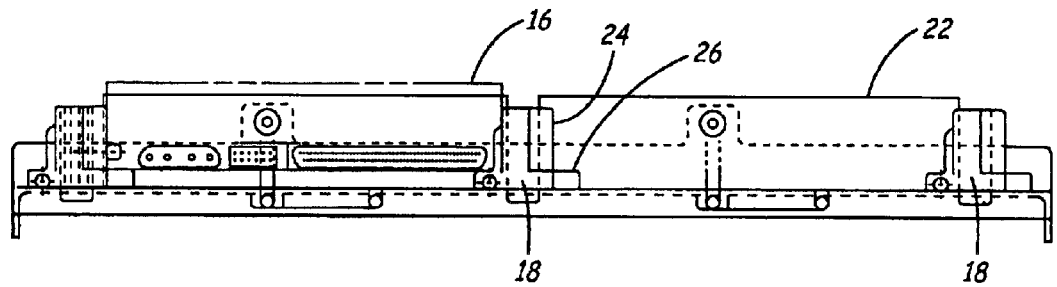
FIG. 1B is an elevated rear view of a hard drive test fixture, according to one embodiment of the present invention.

As shown in FIGS. 1A and 1B, in one embodiment, a pan 12 forms the "backbone" of the fixture 10. Preferably, the pan 12 is fabricated from nonmagnetic stainless steel. Two bends 15 extend longitudinally along the pan stiffening the pan 12. Airflow holes 11 are punched in the pan 12 in a pattern generated to maximize the flow of air through and around the inserted hard disk drive 16 (shown by dashed lines in FIGS. 2A and 2B), while maintaining adequate stiffness to provide rigidity.

Connected to the pan 12 is a bearing surface which serves to guide a hard drive 16 during insertion into the fixture 10, and to locate the hard drive 16 during testing. FIGS. 1A, 1B, 2A, and 2B show one embodiment, wherein the bearing surface includes a plurality of rails in cooperation with a plurality of rollers. It can be appreciated by one skilled in the art, that the bearing surface can also be comprised of other structural components or comprised of multiple structural components working in cooperation to guide and locate a hard drive 16 within the fixture 10.

Screws 10 are positioned to fix the locations of the rails 18 on the pan 12. In the preferred embodiment, the rails 18 are positioned by two screws and two dowel pins, with the dowel pins determining the position on the pan 12. The rails 18 are fabricated preferably from a dissipative plastic material, for example (RTP 387 TFE 10) carbon fiber filler PTFE (polytetrafluoroethylene) lubricated polycarbonate, available from RTP Imagineering of Winona, Minn.

Preferably, each rail 18 is identical, thereby reducing manufacturing costs. In one embodiment, the rails are generally T-shaped and are positioned so that a testing sight is defined between two rails. The rails define generally orthogonal first 24 and second 26 surfaces which support and guide a hard disk drive 16 as it is inserted within the fixture 10. Each rail 18 also includes a slot 20 for locating and supporting a test card 22. The rail 18 also has a plurality of recesses 28 wherein a roller is disposed.

Figure 3:
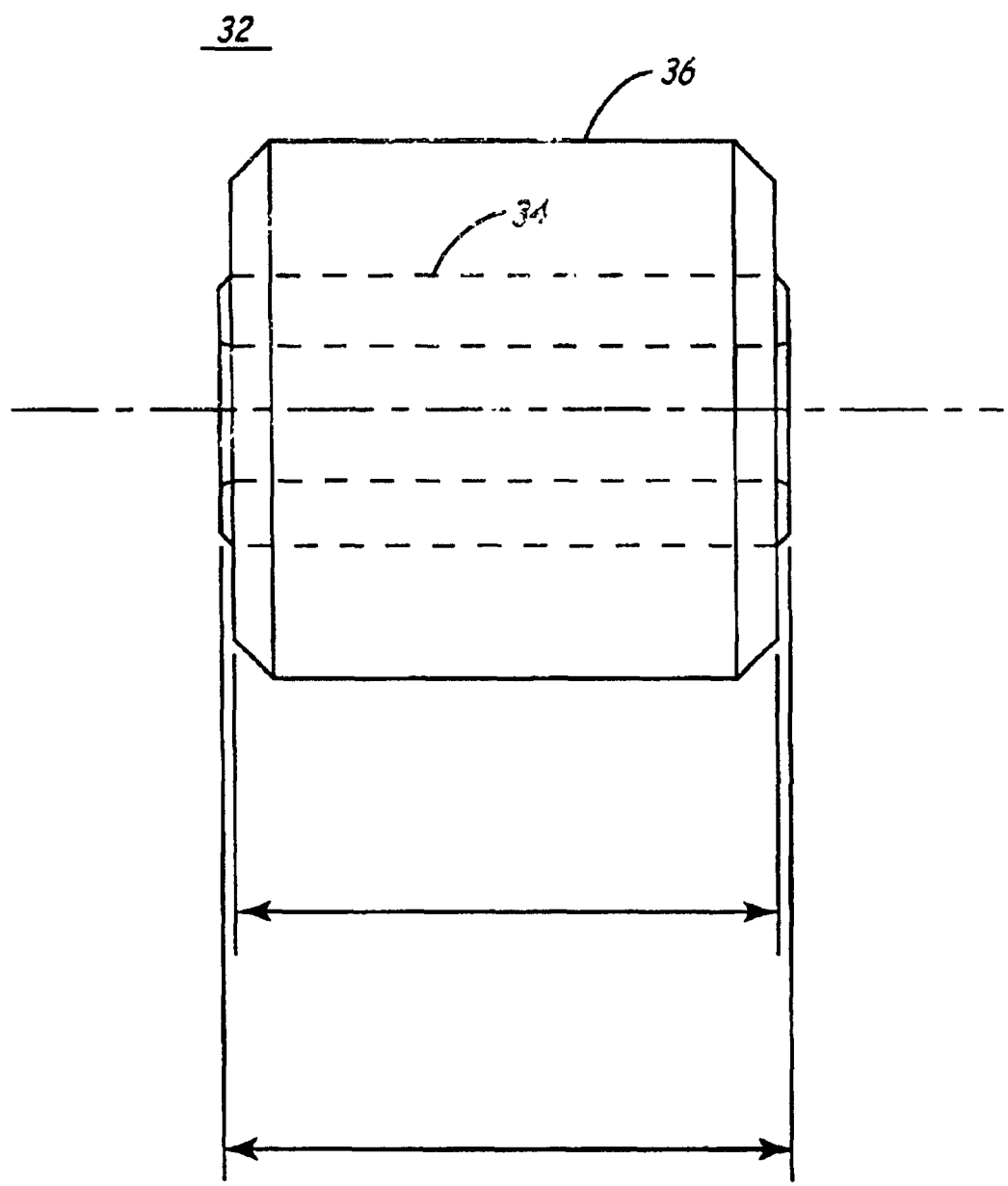
FIG. 3 is an elevated front view of a roller of the hard drive test fixture of FIGS. 1A and 1B.

The rollers cooperate with the rail 18 to guide and locate a hard drive 16. In one embodiment, two types of rollers, idler rollers 30 and pressure rollers 32, are used. FIG. 3 shows an elevated view of a pressure roller 6. The sleeve 36 for the pressure rollers 32 is fabricated from a rather low durometer hardness material, such as a neoprene or urethane, for example. The pressure rollers 32 protrude slightly from the rail 18. The pressure rollers 32 protrude approximately 0.060 inch from the surface of the rail 18, and it is capable of compressing about 0.030 inch. Alternatively, the pressure roller 32 can also be spring biased.

The idler roller 30 includes a brass core 34. The sleeve 36 of the idler rollers 30 is pressed on or glued to the core and is fabricated from a hard plastic such as POMOLUX or stainless steel. The idler rollers 30 protrude slightly from the rail 18. In one embodiment, the idler rollers 30 protrude approximately 0.030 inch from the right (as shown in FIG. 2A) vertical face of the rail 18.

Figure 4A:
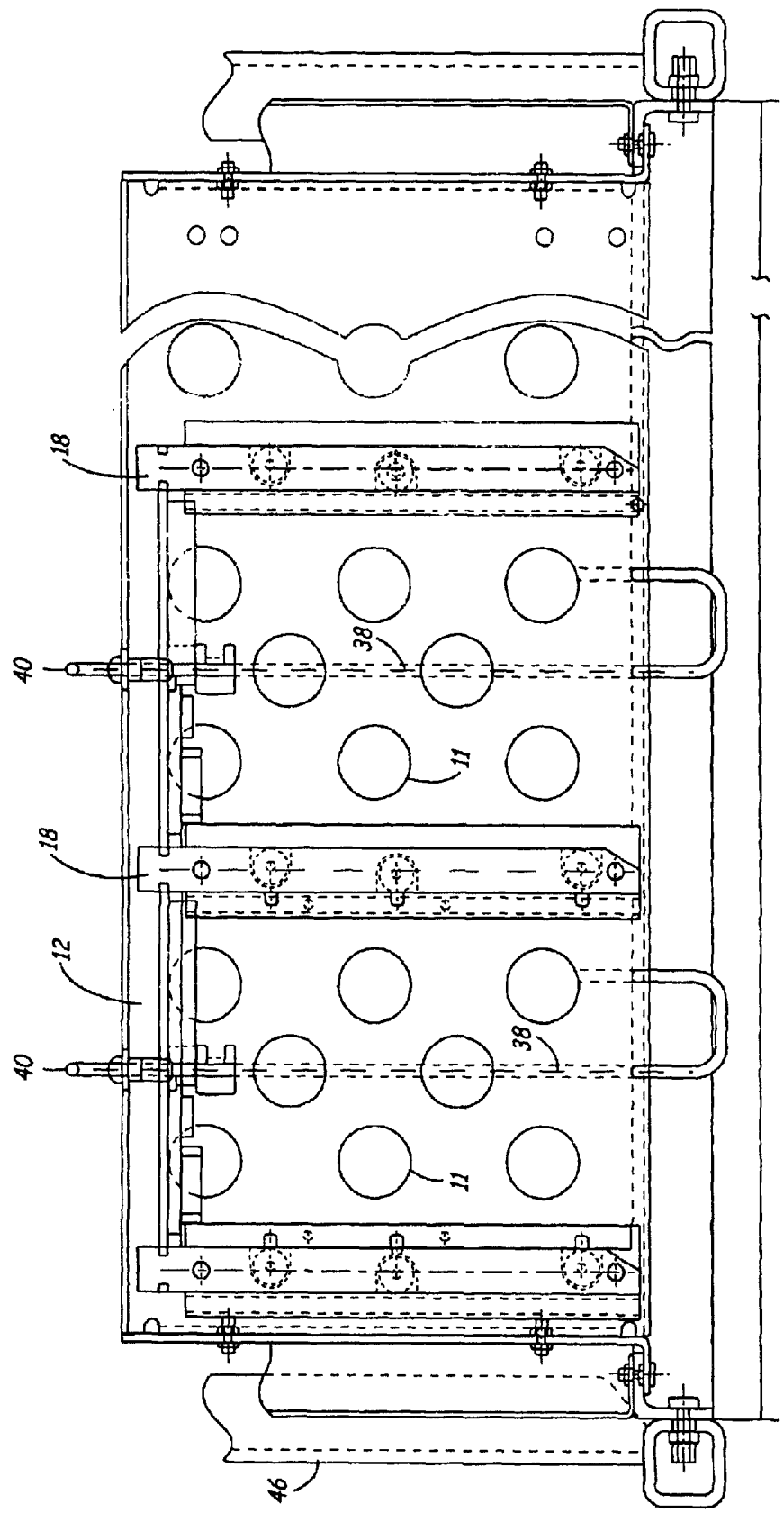
FIG. 4a shows an elevated rear view of an array of hard drive test assemblies.

In one embodiment, as shown in FIGS. 4a and 4b, the test card 22 is disposed in between a pair of rails 18 and is adapted to slip into the slot 20 in a loose fit manner. In one embodiment, the test card 22 has about 0.015–0.030 inches of play parallel to the surface of the pan 12. This limits the vertical excursions permitted for the test card 22. The test card 22 includes an interface which couples to a hard disk under test, and enables the test card to communicate with the hard disk. The test card also communicates with a hard disk testing device (not shown). As can be readily appreciated by one skilled in the art, the test card is typically custom fabricated to interface with the specific hard disk drive 16 undergoing testing. Consequently, a number of different test cards can be used in conjunction with the subject invention. The test card is slidably removable from the rails so that it is easily replaced by a different test card.

As shown in FIGS. 1A and 2A, in one embodiment, the fixture 10 includes an ejection mechanism to disconnect a hard disk drive 16 from the interface on the test card 22 and to partially expel the hard disk drive 16 from the fixture 10. The ejection mechanism includes an ejector rod 38. The ejector rod 38 extends laterally across the pan and engages guide holes 43 located on bends 15. The ejector rod 38 has a back end 40 located adjacent to the test card 22. The back end 40 is shaped to enable a portion thereof to extend through the test card 22 to contact a hard disk 16 attached thereto. The test card 22 is provided with a hole in an appropriate location to allow the back end 40 to travel therethrough. A rubber bumper 42 is connected to the back end 40 for contacting a disk drive. The bumper 42 is made of a material such as a soft urethane that will not mar the drive as it is pulled against it to disengage the drive from the test card 22.

Figure 5:
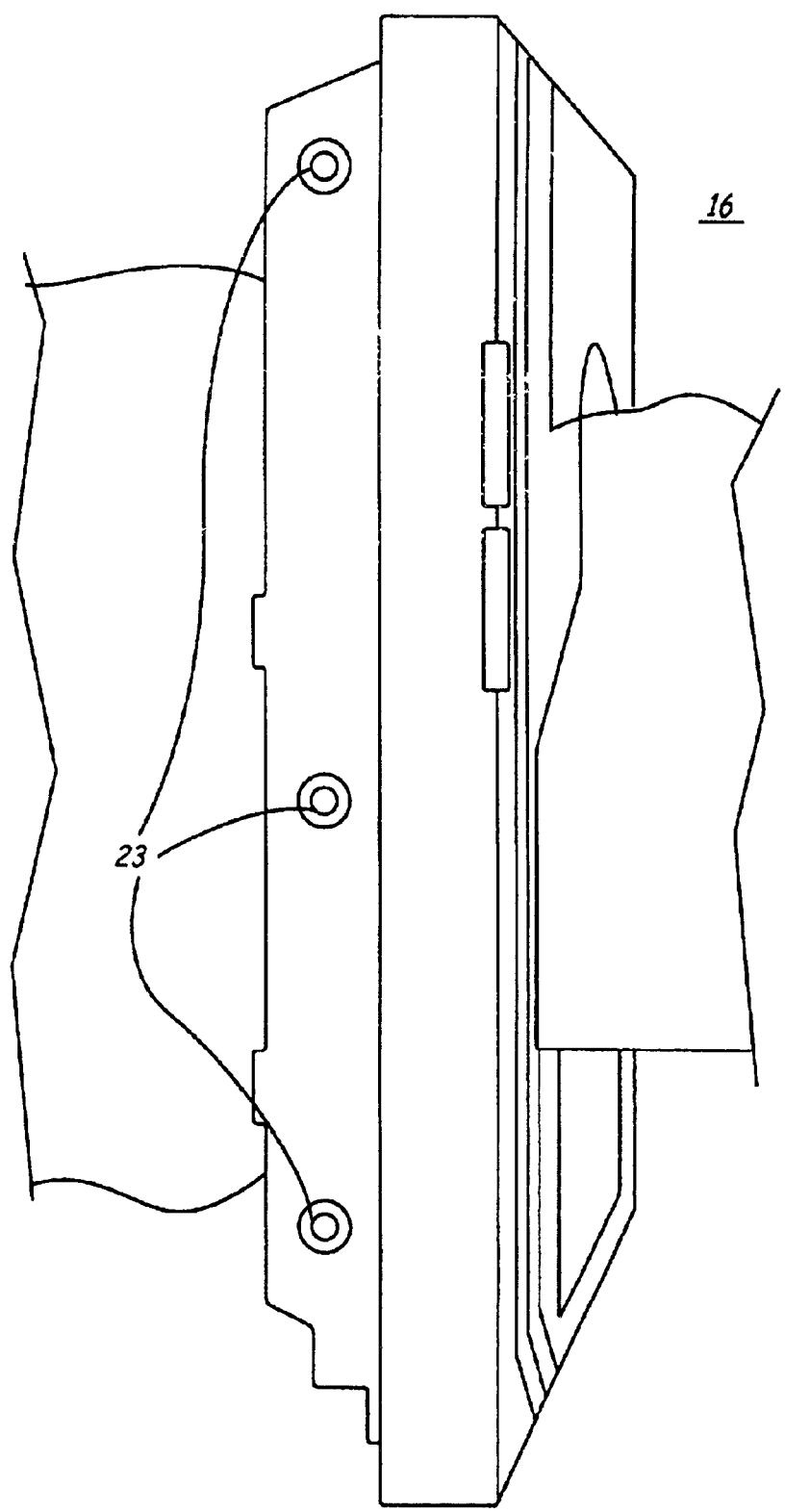
FIG. 5 is a side perspective view of a hard drive used in one embodiment of the present invention.

In one embodiment, as shown in FIG. 4b, the physical position of the drive is controlled by the first 24 and second surface 26 of the rail 18, the bumper 42, the test card 22, the idler rollers 30 and pressure rollers 32. The rollers 30, 32 contact the hard disk drive 16 sides generally at the ANSI standard location of the mounting screw holes 23. FIG. 5 shows a perspective view of a hard drive 36, having mounting screw holes 23. The hard disk drive 16 is inserted into the feature and is guided to the test card, enabling the test card 22 to interface with the hard disk drive 16. After a hard drive is successfully interfaced with the test card, a testing circuit is completed allowing LED 7 to light up.

FIG. 4a shows an array of the hard drive test fixture 10, according to one embodiment of the present invention. As shown in FIG. 4a, the pan 12 accommodates five hard disk drives longitudinally thereon, and is stacked twelve pans high in a frame, to create an array of sixty drives. The sixty-drive array so constructed would occupy a box about 2×2×2 feet. An array is constructed incorporating front and rear "angle iron" frames 44 that define the perimeter of their respective locations. Side panels 46 are attached to the frames 44 by several screws.

In one embodiment, each of the pans 12 is extended to accommodate five hard disk drives 16 and secured to the proper location on the side panels 46 by screws. The rear panel 48 is secured to the rear frame 44 by the same screws that hold the side panel 46. The rear panel 48 is fabricated to carry the appropriate interconnections to the outside, fans, devices for heating or cooling, and whatever equipment a test box or an environmental chamber requires to execute its desired functions. The basic building blocks for testing sixty drives can easily be stacked together to build testers of 120, 180, 240, 360, or greater, drive capacity by simply constructing a mounting framework 44.

FIGS. 6a and 6b, shows one embodiment of the subject invention where the subject fixture 50 is configurable to accommodate disk drives of varying sizes. As shown in FIG. 6, a third surface 52 of the rail 18 can be utilized as a bearing surface for guiding smaller hard disk drives. Additionally, inserts 53 can be attached to the rail 18 so that the testing area can be made to accommodate disk drives of varying sizes.

As shown in FIGS. 6c and 6d, the ejection mechanism can also accommodate hard disk drives of varying sizes. An ejection plate 54 is coupled to the back end 40 of the ejector rod 38. The ejection plate 54 travels through the test card 22 along a slot 56 extending through the testing card 22. Activation of the ejector rod 38 would also activate the ejection plate, the ejection plate 54 contacting the disk drive 16 and causing it to disengage with the test card 22.

While the present invention has been described with reference to several embodiments thereof, those skilled in the art will recognize various changes that may be made without departing from the spirit and scope of the claimed invention. Accordingly, this invention is not limited to what is shown in the drawings and described in the specification but only as indicated in the appended claims. Any numbering or ordering of elements in the following claims is merely for convenience and is not intended to suggest that the ordering of the elements of the claims has any particular significance other than that otherwise expressed by the language of the claim.

We claim:

1. A hard drive test fixture comprising:
   a pan;
   a test card coupled to the pan;
   a bearing surface for guiding a hard drive to the test card; and an ejection mechanism.

2. The fixture of claim 1, wherein the bearing surface includes a plurality of rollers coupled to the pan.

3. The fixture of claim 1, wherein the bearing surface includes a rail connected to the pan.

4. The fixture of claim 1, wherein the bearing surface includes a roller disposed within a recess in the rail.

5. The fixture of claim 1, wherein the bearing surface includes a pressure roller coupled to the pan, the pressure roller being relatively compressible.

6. The fixture of claim 1, wherein the pan includes a plurality of airflow holes, and wherein a plurality of rails are connected on the pan to define a plurality of testing surfaces.

7. The fixture of claim 1, wherein the bearing surface includes a first bearing surface and a second bearing surface, and wherein each bearing surface guides a different sized hard drive to the test card.

8. A testing fixture for an environmental chamber comprising:
   a pan adapted to be inserted within the environmental chamber;
   a plurality of rails connected to the pan;
   a test card located by a pair of rails; and
   an ejection mechanism.

9. The fixture of claim 8, wherein a roller is disposed within a recess in each rail.

10. The fixture of claim 8, wherein the ejection mechanism includes a rod having a secured portion that is selectably extendable through an aperture in the test card.

11. The fixture of claim 8, wherein the test card includes an interface to a hard drive.

12. The fixture of claim 8, and further comprising an indicator mechanism to indicate proper insertion of a hard drive.

13. An environmental testing chamber comprising:
    a frame;
    a pan received by the frame;
    a plurality of rails connected to the pan;
    a plurality of rollers disposed within a recess in the rail;
    a test card located between a pair of rails; and
    a hard drive ejection mechanism coupled to the pan.

14. The environmental chamber of claim 13, and further comprising a temperature control.

15. The environmental chamber of claim 13, and further comprising an airflow mechanism.

16. The environmental chamber of claim 15, wherein the airflow mechanism includes a plurality of blowers.

17. The environmental chamber of claim 15, and further comprising a humidity control.

18. A hard drive test fixture for accommodating hard drives of multiple sizes, comprising:
    a pan;
    a test card coupled to the pan;
    a first bearing surface coupled to the pan; and
    a second bearing surfaced coupled to the pan;
    wherein the first and second bearing surface each guide a hard drive of a different size to the test card.

19. The fixture of claim 18, and further comprising an ejection mechanism capable of ejecting disk drives of varying sizes.

20. The fixture of claim 19, wherein the ejection mechanism includes a rod extending through the test card and a plate extending through the card, the plate coupled to the rod.

21. The fixture of claim 18, wherein the first and second bearing surfaces are defined by an L-shaped portion of a rail.

22. The fixture of claim 21, and further comprising an insert connected to a bearing surface for accommodating a hard drive of a specific size.

23. The fixture of claim 20, wherein the first and second bearing surface each includes a roller partially protruding from a recess in the rail.

* * * * *